(12) United States Patent
Aratake

(10) Patent No.: US 7,459,334 B2
(45) Date of Patent: Dec. 2, 2008

(54) METHOD OF MANUFACTURING QUARTZ CRYSTAL VIBRATING PIECE

(75) Inventor: Kiyoshi Aratake, Chiba (JP)

(73) Assignee: Seiko Instruments Inc. (JP)

( * ) Notice: Subject to any disclaimer, the term of this patent is extended or adjusted under 35 U.S.C. 154(b) by 199 days.

(21) Appl. No.: 11/341,745

(22) Filed: Jan. 27, 2006

(65) Prior Publication Data
US 2006/0175288 A1      Aug. 10, 2006

(30) Foreign Application Priority Data
Feb. 7, 2005      (JP)      ............................. 2005-030462

(51) Int. Cl.
*H01L 21/00*      (2006.01)

(52) U.S. Cl. .......................... 438/71; 438/48; 438/551; 438/552; 257/E21.415

(58) Field of Classification Search ............... 438/52, 438/48, 71, 551, 552; 257/E21.415; 228/179.1
See application file for complete search history.

(56) References Cited

U.S. PATENT DOCUMENTS 5,998,233 A * 12/1999 Sugitani et al. ............... 438/52
6,332,567 B1 * 12/2001 Ikegami et al. ........... 228/179.1

OTHER PUBLICATIONS

Patent Abstracts of Japan, publication No. 10-270967, publication date Oct. 9, 1998.

* cited by examiner

*Primary Examiner*—Walter Lindsay, Jr.
*Assistant Examiner*—Abdul Fattah Mustapha
(74) *Attorney, Agent, or Firm*—Adams & Wilks

(57) ABSTRACT

A method of manufacturing a quartz crystal vibrating piece is provided. Etching masks of different sizes are each arranged on respective front and rear surfaces of a quartz crystal wafer such that the etching mask on one of the surfaces (e.g., the rear surface) is larger than the other etching mask. The quartz crystal wafer is etched using the etching masks so that a projection is formed on a side of the quartz crystal wafer due to the difference in size of the etching masks, and is overetched to remove the projection.

11 Claims, 8 Drawing Sheets

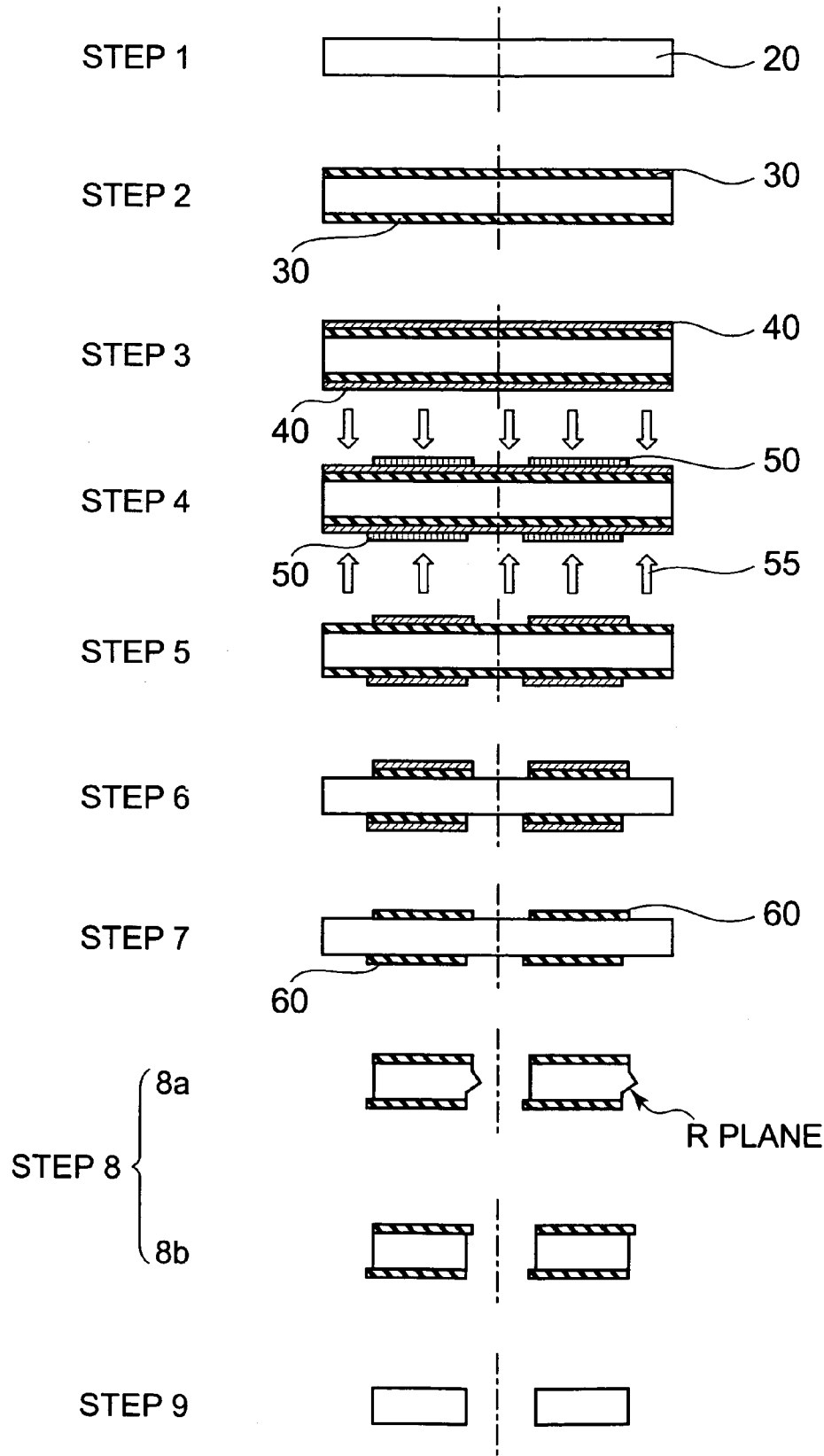

METHOD OF MANUFACTURING QUARTZ CRYSTAL VIBRATING PIECE

BACKGROUND OF THE INVENTION

1. Field of the Invention

The present invention relates to a quartz crystal vibrating piece formed from a quartz crystal wafer by etching, a quartz crystal vibrator using this quartz crystal vibrating piece, and an oscillator, an electronic device, and an electric wave clock having the quartz crystal vibrating piece wave clock.

2. Description of the Related Art

As an indispensable electronic element for the manufacture of industrial goods, there is a quartz crystal vibrator in which a quartz crystal vibrating piece is enclosed in a closed container.

A quartz crystal has a characteristic that it is expanded and contracted due to a piezoelectric effect if a voltage is applied to it and when this is incorporated in a feedback circuit of a resonance circuit, the quartz crystal carries out very accurate and stable oscillation.

By using this characteristic, the quartz crystal vibrator is used for all electronic devices including an oscillator, an electronic device such as an information communication device and a mobile device, and home appliances or the like having a clock function and a frequency control mechanism.

The quartz crystal vibrator is of a lead type in which a lead wire is arranged and of a surface mounting type in which a package is directly mounted on a printed board or the like.

In recent years, these electronic goods have been downsized and are densely packed. The quartz crystal vibrator used in such electronic goods is required to be downsized and as a result, the quartz crystal vibrating piece to be enclosed is also downsized.

As a manufacturing method of the quartz crystal vibrating piece that has been downsized for manufacturing the downsized quartz crystal vibrator, a method to form it from the quartz crystal wafer by etching has been frequently used. According to this method, a mask is formed on the opposite faces of the quartz crystal wafer by a protection film and the quartz crystal is etched by an etching solution such as a fluorinated acid and an etching gas such as $CF_4$ so as to form a quartz crystal vibrating piece.

Here, a method of forming a quartz crystal vibrating piece will be described with reference to the drawings. FIG. 7 is a view showing an outline of a quartz crystal vibrating piece. FIG. 8 shows steps for forming a conventional tuning-fork type quartz crystal vibrating piece. A shape of a quartz crystal vibrating piece 10 is formed into the shape of a mask 60. The mask 60 is patterned by photolithography or the like. In this method, the sizes of the masks 60 to be formed and arranged on the opposite surfaces of a quartz crystal wafer 20 are the same and the positions where they are arranged are also the same.

A step 1 is a step for cleaning and baking the quartz crystal wafer 20 to be a base material of the quartz crystal vibrating piece 10.

A step 2 is a step to form an anticorrosion thin film 30 that is made of a resistance against etching of quartz crystal and is to be a base material of the mask 60.

A step 3 is a step to form a photo resist film 40.

A step 4 is a step to shield an ultraviolet ray 55 by a photo mask 50 and expose the photo resist film 40. In this case, the sizes of the photo masks 50 formed and arranged on the photo resist film 40 are the same and the positions where they are arranged are also the same.

A step 5 is a step to develop the photo resist film 40 that is exposed by the ultraviolet ray 55.

A step 6 is a step to mold the thin film 30 into the mask 60 by etchant of the anticorrosion thin film in the shape of the developed photo resist film 40. In this time, the sizes of the masks 60 formed and arranged on the opposite surfaces of the quartz crystal wafer 20 are the same and the positions where they are arranged are also the same.

A step 7 is a step to separate the photo resist film 40.

A step 8 is a step to perform etching of the quartz crystal wafer 20 by etching of the quartz crystal using the mask 60 as a mask material. A reference numeral 8a is a view showing the state in the middle of etching, and a reference numeral 8b is a view showing the state that etching is finishes to the last shape.

A step 9 is a step to stripping the mask 60.

Hereinafter, the quartz crystal vibrating piece is completed through a formation step of an electrode film or the like.

The method of forming the quartz crystal vibrating piece is a method to expose the masks used on the front and rear surfaces from the front surface side and the rear surface side and etch them. However, there is also a method to deposit the anticorrosion thin film by a transparent anticorrosion film to have a mask only on one surface, expose only from the mask surface side, and etch it.

A magnitude of frequency change per unit size is increased by downsizing of the quartz crystal vibrating piece, and at a conventional processing accuracy, the frequencies at individual vibrating pieces are largely varied. FIG. 9 is a view explaining a magnitude of frequency change per unit size of a tuning-fork type quartz crystal vibrating piece. A horizontal axis represents a size of an arm width (unit: μm) and a vertical axis represents a magnitude of frequency change per size of an arm width 1 μm (unit: Hz/μm). Here, the explanation is given taking the tuning-fork type quartz crystal vibrating piece as an example. Particularly, in a range where the size of the arm width is below 100 μm it is known that the magnitude of frequency change is rapidly increased. It is difficult to bring the matching accuracy of the front and rear surfaces to perform patterning when quartz crystal is formed by etching within 1 micrometer including repeatability in an exposure system using a mask aligner.

FIG. 10 is a view showing an example that a deviation of a mask is generated in a conventional tuning-folk type quartz crystal vibrating piece shape forming step. In the opposite surfaces-simultaneous contacting exposure in accordance with a mechanical deviation and in a projection exposure into a large area in accordance with an aberration of a lens, as shown in a step 4 of FIG. 10, a deviation is generated on the masks 60 on the front and rear surfaces and the shape of the quartz crystal vibrating piece 10 is formed as shown from the steps 8 to 9, so that variations are caused in the size due to the amount of deviation.

In addition, according to the above-described method for masking only one surface and exposing only the mask surface side, the positional accuracy of the mask is secured, however, in the exposure to the rear surface side, the size is changed due to diffraction and interference.

Further, in the pattern of the lower mask at the rear surface side, the mask is deviated in the case that an etching direction is not a direction perpendicular to the quartz crystal wafer because the pattern of the upper mask at the front surface side is transcribed in a direction perpendicular to the quartz crystal wafer to be formed.

SUMMARY OF THE INVENTION

Therefore, it is an object of the invention to provide a manufacturing method of a small-sized quartz crystal vibrating piece, which can decrease processing variations due to accuracy of matching front and rear surfaces of a mask in etching of a quartz crystal wafer.

According to the invention, in order to attain the above-described object, the sizes of the masks on the front and rear surfaces are not equal, the size of a reference mask is set small, and a relative mask is larger than the size of the reference mask (first means).

In addition, since a quartz crystal is an anisotropic crystal, depending on a cut angle of a quartz crystal wafer to be used, the direction of etching is not a vertical direction but the direction may be deviated. Accordingly, the reference mask is arranged in the inside of the range that is left by etching due to the relative mask (second means).

In the second step, the offset amount for arranging the reference mask in the inside of the range that is left by etching due to the relative mask is set at not more than 10 μm (third means). It is also possible to decrease the influence of the anisotropic crystal face caused by positively displacing the front and rear masks each other.

In addition, the invention uses a quartz crystal vibrating piece manufactured by using the front and rear masks, of which sizes are not equal each other and the size of the reference mask is set smaller than that of the relative mask, as a quartz crystal vibrator (fourth means).

According to the invention, with reference to the embodiment shown in FIG. 3, even if a gap is generated between the reference mask 61 and the relative mask 62, the final shape of the quartz crystal vibrating piece 10 is a part where the reference mask 61 and the relative mask 62 overlap with each other, so that it is possible to decrease the influence on size variation of the vibrating piece more as compared to the case that the mask 60 of the same size is used.

Further, due to the second means, the entire part where the reference mask 61 and the relative mask 62 overlap with each other becomes the size of the reference mask 61, so that it is possible to decrease the influence on size variation of vibrating piece more as compared to the case that the mask 60 of the same size is used.

In addition, due to the third means, it is also possible to decrease the influence of the anisotropic crystal caused by positively displacing the reference mask 61 and the relative mask 62.

According to the first to third means, it is possible to manufacture the quartz crystal vibrating piece 10 that conventionally could be manufactured only by an expensive manufacturing apparatus with a high degree of accuracy inexpensively and stably by using a two-sided projection with a high throughput for a large-diameter wafer.

In addition, it is also possible to inexpensively and stably supply the quartz crystal vibrating piece, the quartz crystal vibrator, the electronic device, and the electric wave clock, which uses the quartz crystal vibrating piece manufactured by any one method among the first to third means.

BRIEF DESCRIPTION OF THE DRAWINGS

FIG. 10 is a view showing conventional tuning fork type quartz crystal vibrating piece shape forming steps and explaining an example that a displacement of a mask is generated.

DETAILED DESCRIPTION OF THE PREFERRED EMBODIMENTS

(1) Outline of the Embodiment

Here, the embodiment will be described taking a manufacturing method of a tuning-fork type quartz crystal vibrating piece as an example.

At the arm part of the quartz crystal vibrating piece, the size of the reference mask is smaller than the size of the other relative mask, the location of the reference mask is arranged so as to be displaced into the inside of the range that is left by etching due to the relative mask, and its offset amount is set at not more than 10 μm.

As an etchant to be used for etching of the quartz crystal here, a solution mainly composed of fluorinated acid is used. Therefore, as a mask for etching, a film superimposing Au on Cr that is a base is used. Here, this structure is described as Cr—Au.

During etching for a long time, some mask displacement is absorbed and finally, the vibrator is formed in an upper mask-shape.

(2) Details of the Embodiment(s)

Hereinafter, the embodiment (s) of the invention will be described in detail with reference to the drawings.

Figure 1:
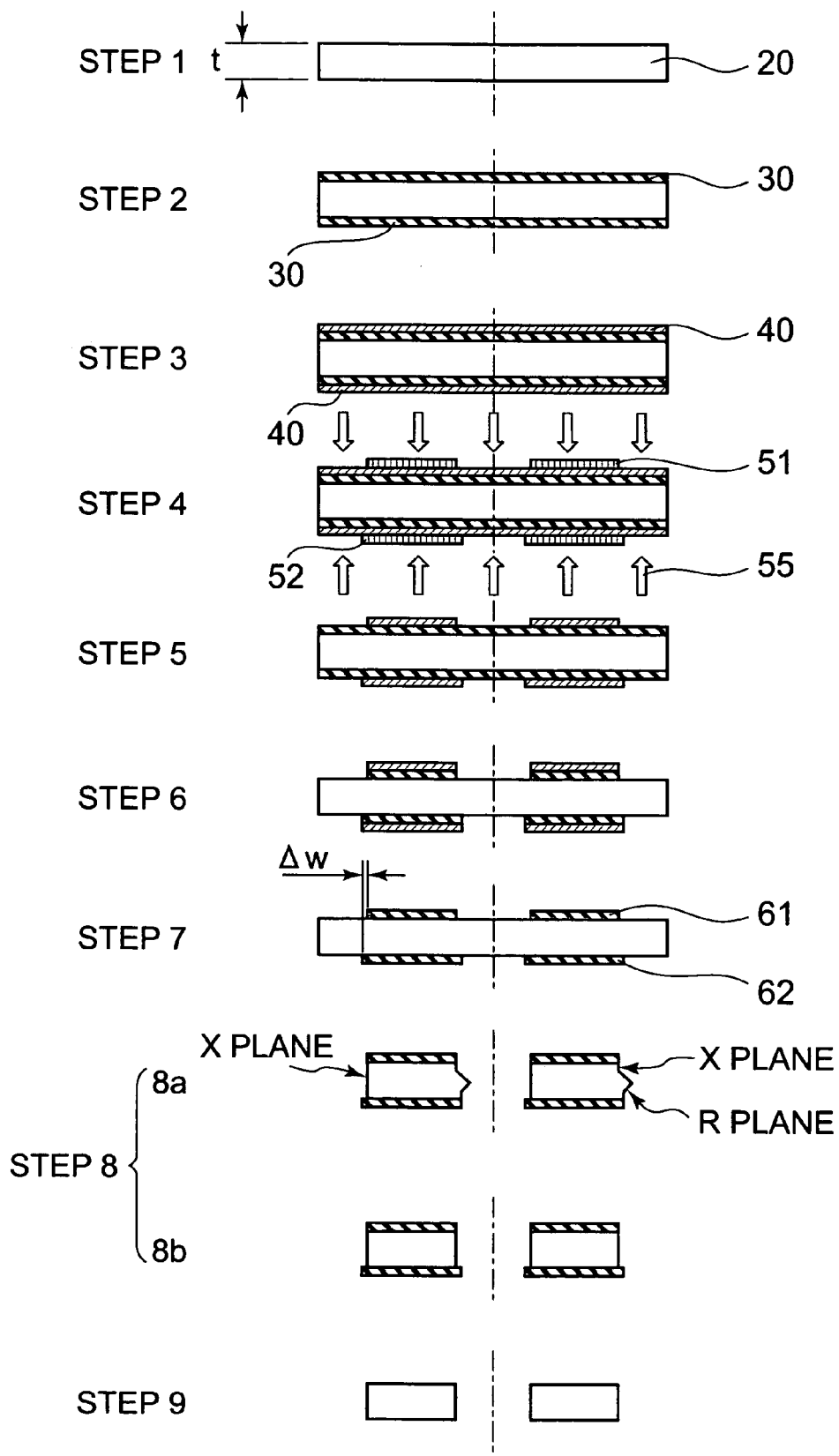
FIG. 1 is a view explaining an example of a manufacturing method of a quartz crystal vibrating piece according to the invention.
Figure 7:
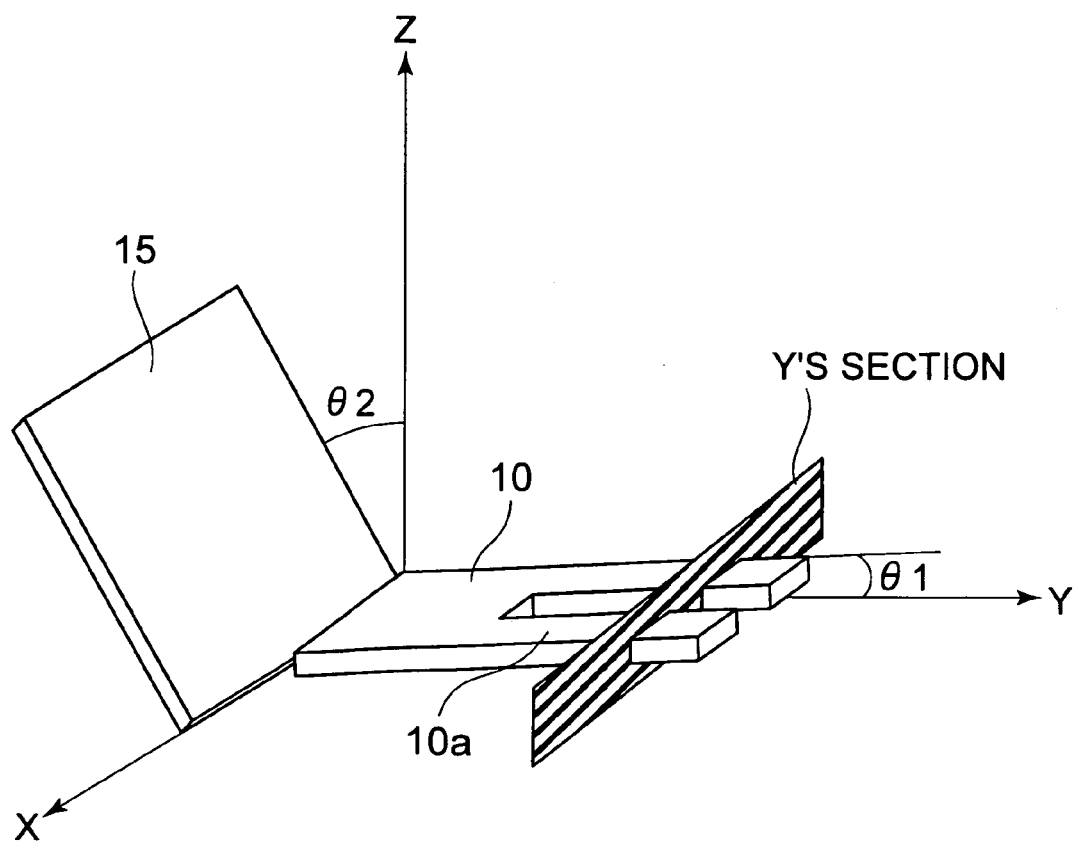
FIG. 7 is a view showing the outline of the quartz crystal vibrating piece.
Figure 8:
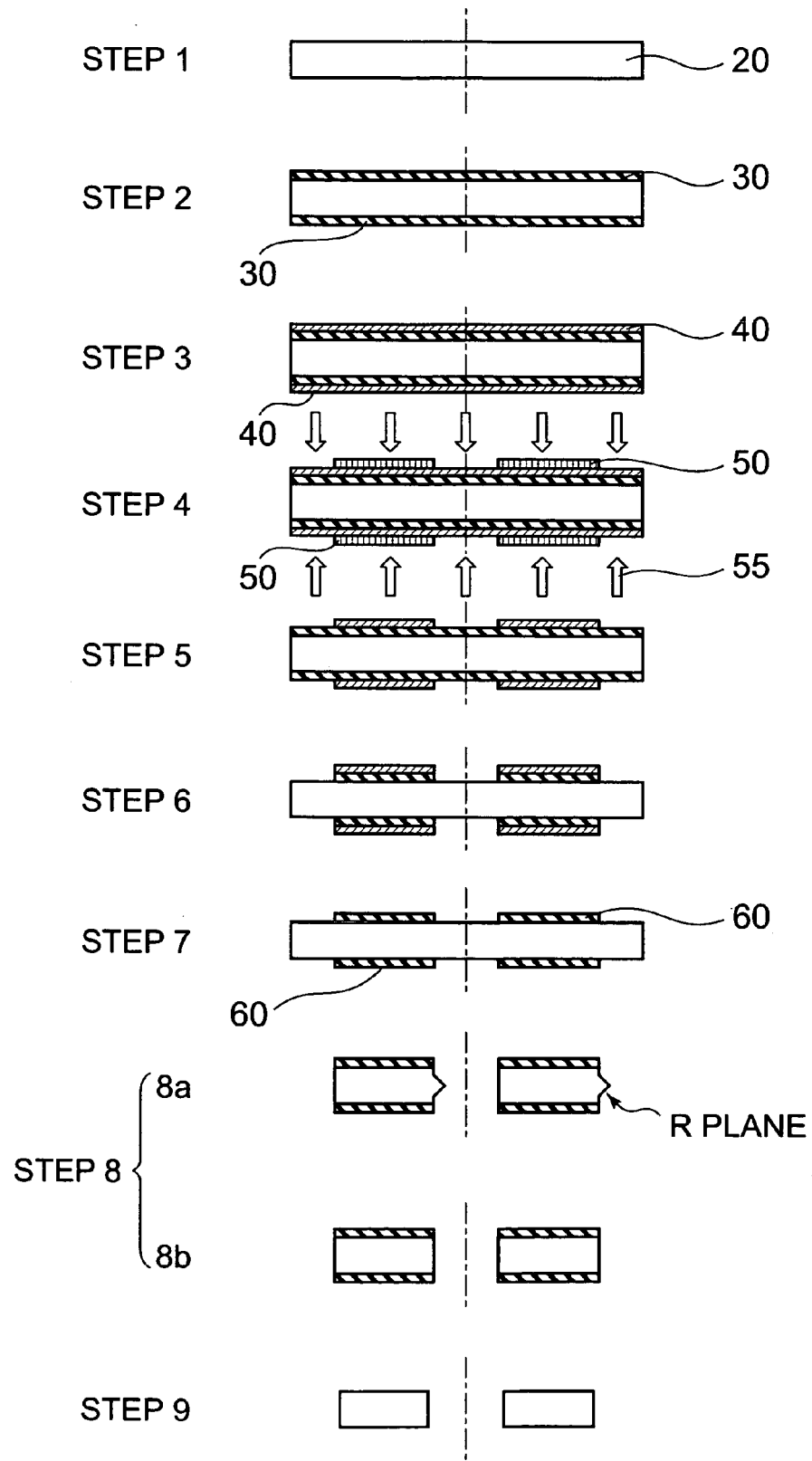
FIG. 8 is a view explaining conventional tuning fork type quartz crystal vibrating piece shape forming steps.
Figure 9:
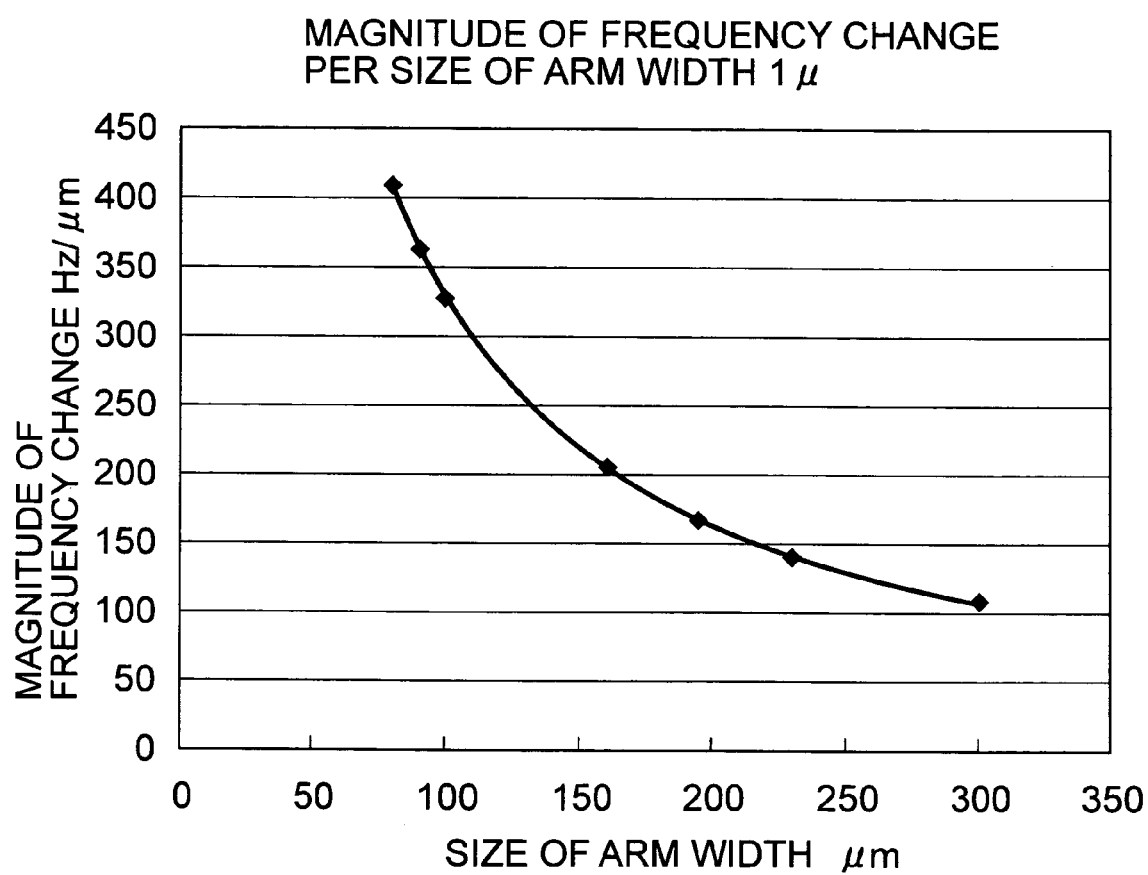
FIG. 9 is a view explaining a magnitude of frequency change per unit size of a tuning-fork type quartz crystal vibrating piece.

FIG. 1 is a view showing steps for forming a tuning fork type quartz crystal vibrating piece Each view of each step in FIG. 1 shows a Y's section of the quartz crystal vibrating piece 10 shown in FIG. 7. In FIG. 1, the upper side is illustrated as a front side. Here, an upper mask is defined as a reference mask. The reference mask 61 and the relative mask 62 are patterned by photolithography. In the relative mask 62, a protrusion amount ΔW to the reference mask 61 is a set at a minute amount.

A step 1 is a step to carry out cleaning and baking of the quartz crystal wafer 20 that is the base material of the quartz crystal vibrating piece 10. The quartz crystal wafer 20 is polished and processed so that a thickness t of the quartz crystal wafer 20 is about 100 μm. Here, the quartz crystal wafer 20 is illustrated with the vicinity of one chip in the wafer abstracted.

A step 2 is a step to form the anticorrosion thin film 30 made of Cr—Au that is a material having a resistance to an etchant of quartz crystal. The reference mask 61 and the relative mask 62 use a Cr—Au film formed by this spattering method as a base material. The anticorrosion thin film 30 is formed on both of the front and rear surfaces in order to protect the quartz crystal wafer 20 from corrosion due to etching. The film thicknesses of these Cr and Au are defined as 500 Å (angstrom) and 1,000 Å, respectively.

A step 3 is a step to form the photo resist film 40. The photo resist film 40 is formed by spin coating. A film thickness is defined as not more than 1 μm in order to achieve the size of a mask with a high degree of accuracy.

A step 4 is a step to shield the light of the ultraviolet ray 55 by photo masks 51 and 52 and carry out exposure of the photo resist film 40. In the view, a mask glass is omitted. The photo mask 51 is a photo mask for patterning the reference mask 61. The photo mask 52 is a photo mask for patterning the relative mask 62. According to the present embodiment, the photo mask 51 is set as the upper mask and the photo mask 52 is set as the lower mask. In this case, a positional relation between the photo mask 51 and the photo mask 52 is achieved so that respective centers of an X axis and a Y axis are used because a cut angle θ1 of the quartz crystal vibrating piece 10 shown in FIG. 7 is about 1° (degree).

Conventionally, an exposure system is difficult to select because, even though it involves patterning with a high degree of accuracy, it uses a large diameter wafer in order to carry out mass production and reduce cost.

The double-sided and simultaneous contact exposure causes a pattern defect due to sticking and in addition to this, it cannot solve a problem relating to mechanical accuracy.

On the other hand, in the double-sided and simultaneous projection exposure, the position of the peripheral part is varied due to aberration and distorting of a lens, and as a result, it leads to displacement of the upper and lower masks.

According to the invention, the displacements of the upper and lower masks are allowed to some extent, so that the double-sided and simultaneous projection exposure with a high throughput and without a pattern defect is effective.

A step 5 is a step to develop the photo resist film 40 that is exposed by the ultraviolet ray 55. The step 5 of FIG. 1 shows the state that development has been finished.

A step 6 is a step to mold the anticorrosion thin film 30 in a shape of the developed photo resist film 40 so as to be made into the reference mask 61 and the relative mask 62 formed by the etching of Au and Cr. Since the centers of the photo masks 51 and 52 are made the same, in the tuning fork type vibrating piece of the cut angle 1°, the reference mask 61 is arranged at the inside of the range that is left by the reference mask 62 due to etching.

A step 7 is a step to separate the photo resist film 40. In the step 7 of FIG. 1, the state of the stage that the separation is finished is shown.

A step 8 is a step to carry out etching of the quartz crystal wafer 20 by the etching of the quartz crystal using the reference mask 61 and the relative mask 62 as the mask material. The reference numeral 8a in FIG. 1 is a view showing the state of the mid stream of etching, and the reference numeral 8b is a view showing the state that the etching is finished. The etchant used in this etching step is mainly composed of fluorinated acid.

During the etching stage, one side of the X axis is etched almost vertically, however, other one side is formed in a step-like shape and a projection made of an R plane is formed at a center portion.

In this stage, the variation of the size in each quartz crystal vibrating piece 10 to be formed within the wafer has been large conventionally. In addition, in the initial stage that etching is not progressed, the variation of the frequency is rather than small.

The reference numeral 8b of FIG. 1 is the state that the quartz crystal wafer 20 has been etched till the last shape. The projection made of the R plane seen in 8a of FIG. 1 is decreased and a step-like difference in level also disappears by etching from the side of the reference mask 61. By providing over etching so far, the variation of the size in each quartz crystal vibrating piece 10 to be formed within the wafer has been small.

In addition, if the amount ΔW that the reference mask 61 is arranged in the inside of the range left by the relative mask 62 due to etching is too large, it takes a long time to erase the projection made of the R plane and the step-like difference in level, so that productivity is lowered. The amount ΔW is preferably not more than 10 μm.

According to a conventional method, in the shape of an X plane in this time, an etching border line can be seen at the center on the section from the upper and lower directions, however, according to the present embodiment, this border line disappears by etching from the side of the reference mask 61.

A step 9 is a step to separate each of the reference mask 61 and the relative mask 62. In the view, the state that separation has been finished is illustrated.

Hereinafter, the quartz crystal vibrating piece has been completed through a step to form an electrode film or the like.

According to the manufacturing method of the quartz crystal vibrating piece of the invention, since the displacement of the upper and lower masks are allowed to some extent, an exposure by a stepper to perform alignment while monitoring the rear face will be possible in the future. In addition, according to this manufacturing method, it is also possible to prevent the variation of a magnification at the peripheral part due to aberration and distortion generated by the projection exposure. According to the above-described method, it is possible to decrease the variation of processing, manufacture the portable quartz crystal vibrating piece, and stably and inexpensively supply it.

According to the above-described manufacturing method, the tuning-fork type quartz crystal vibrating piece is described with reference to FIG. 1, however, this can be applied to the manufacturing method of the quartz crystal vibrating piece from the quartz crystal wafer having a large cut angle θ2 about 35° (degrees) like an AT cut vibrating piece 15 shown in FIG. 7 in the same way. However, in the exposure step of the photo resist film 40 of the step 4, it is necessary to note a positional relation between the photo mask 51 and the photo mask 52.

Figure 2:
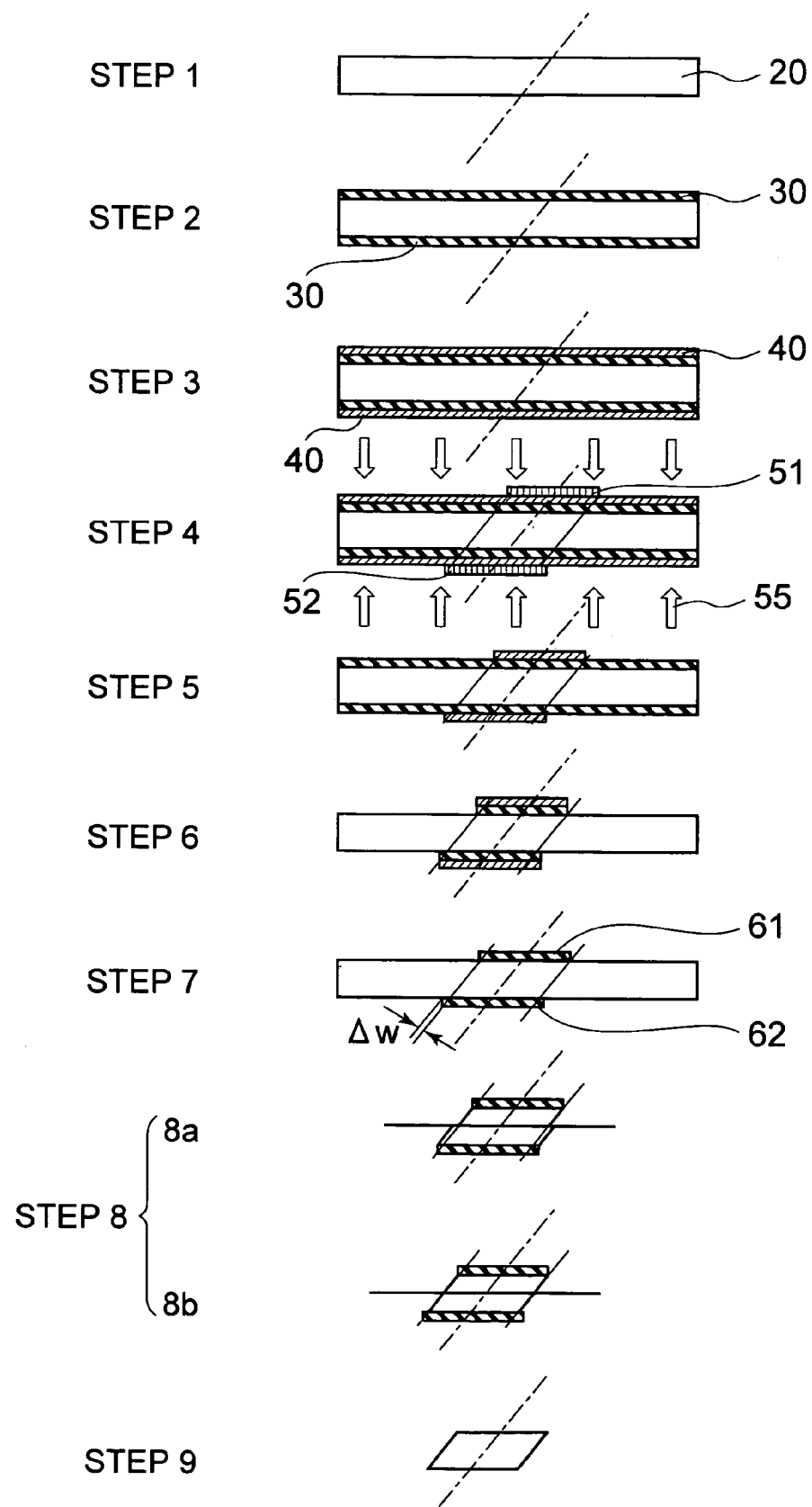
FIG. 2 is a view explaining the other example of a manufacturing method of a quartz crystal vibrating piece according to the invention.

FIG. 2 is a view explaining a shape forming step of an AT cut vibrating piece. Each name of first to ninth steps and each member shown in FIG. 2, those common to FIG. 1 are the same contents as those described before so that the explanation there of is herein omitted.

In the fourth step in FIG. 2, the position of the photo mask 52 is largely displaced from the position of the photo mask 51. In the step 4 of FIG. 1, a cut angle θ1 of the quartz crystal-vibrating piece 10 is about 1°, so that the positional relation between the photo mask 51 and the photo mask 52 is made so that the centers of respective X axis and Y axis are the same. However, it is preferable that the photo mask 51 is arranged in the inside of the range that is left by the relative mask 62 to be patterned by the photo mask 52 due to etching on the quartz crystal wafer having a large cut angle.

By arranging the photo mask 51 and the photo mask 52 in this way, the steps on and after can be also carried out as same as the shape forming step of the tuning-fork type quartz crystal vibrating piece and the same effect can be obtained.

Figure 3:
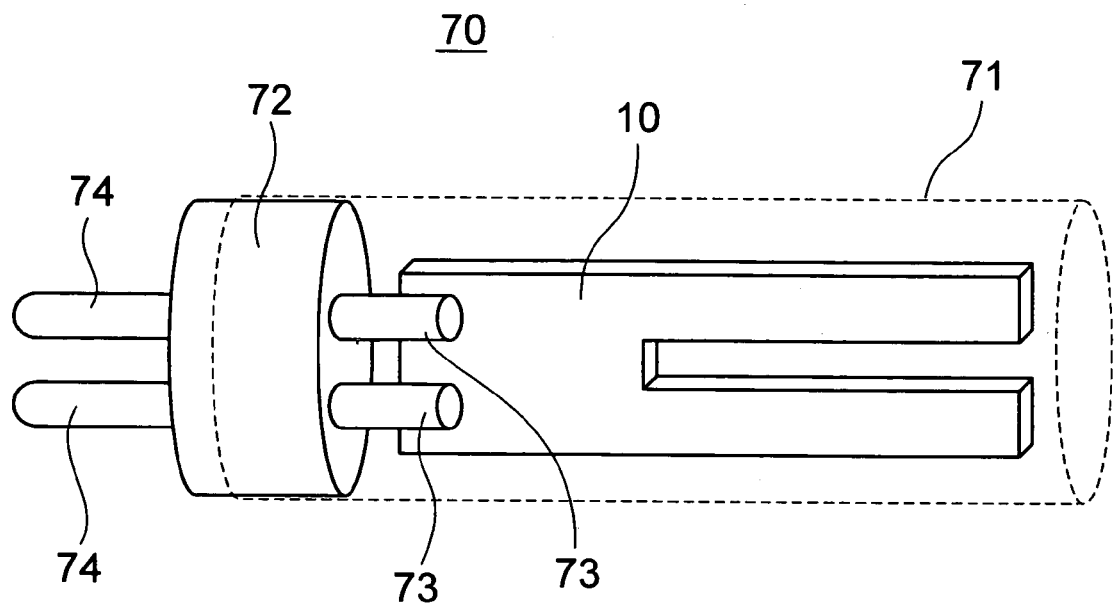
FIG. 3 is a view showing an outline of an example of a quartz crystal vibrator using the quartz crystal vibrating piece that is manufactured by the manufacturing method according to the invention.

Next, the quartz crystal vibrating piece manufactured by the above-described manufacturing method according to the present embodiment will be described. FIG. 3 is a view showing an example of a structure of a quartz crystal vibrator using a tuning-fork type quartz crystal vibrating piece as a quartz crystal vibrating piece.

As shown in FIG. 3, the quartz crystal vibrator is configured by three parts including the quartz crystal vibrating piece 10, a case 71 provided so as to cover this quartz crystal vibrating piece, and a plug 72 having penetrating two leads. Here, the case 71 is illustrated by a dot line as a perspective view.

The case 71 and the plug 72 are sealed in a vacuum and the interiors of them are kept vacuum. The quartz crystal vibrating piece 10 is connected to an inner lead 73 among the leads to penetrate through the plug and be pulled in it. According to a connection method, soldering plating is applied to the inner lead 73 to be connected to an electrode on the quartz crystal vibrating piece in the form of soldering plating.

The quartz crystal vibrator manufactured and configured thus is connected to a substrate or the like by soldering plating.

By mounting the quartz crystal vibrating piece according to the present embodiment, the present quartz crystal vibrator is downsized so as to be supplied inexpensively and stably.

Next, an oscillator will be described, which uses a quartz crystal vibrator on which a quartz crystal vibrating piece manufactured by a manufacturing method according to the above-described present embodiment and is connected to an integrated circuit.

Figure 4:
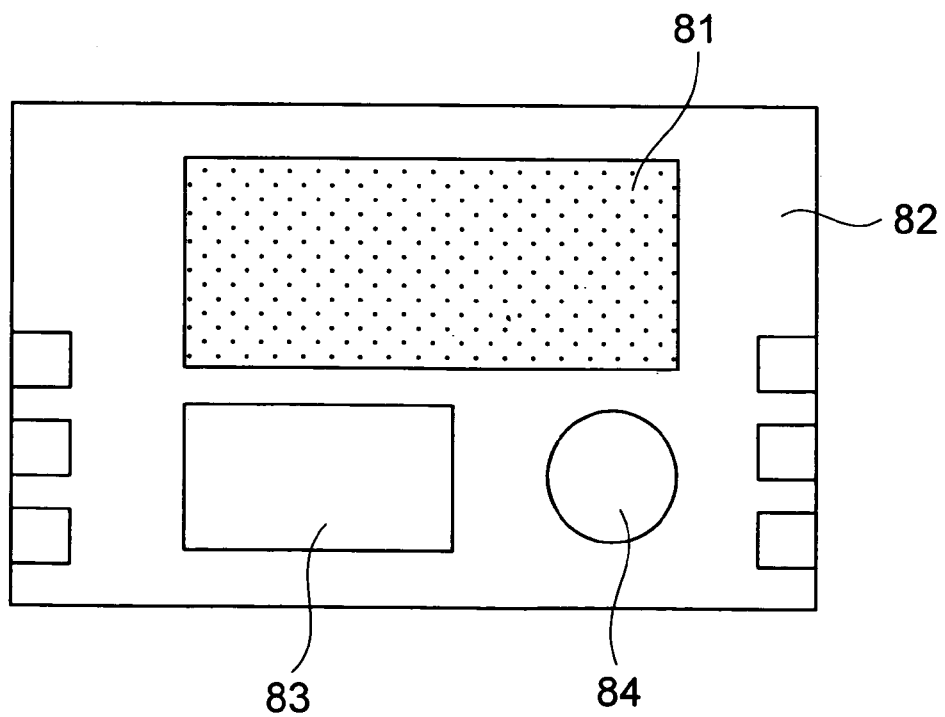
FIG. 4 is a plan view showing an example of the structure of a quartz crystal oscillator using a quartz crystal vibrator having the quartz crystal vibrating piece that is manufactured by the manufacturing method according to the invention.

FIG. 4 is a plain view showing an example of the structure of a tuning-fork type quartz crystal oscillator using a tuning-fork type quartz crystal vibrator as a quartz crystal vibrator and shows a surface mounting type piezoelectric oscillator.

In FIG. 4, a tuning-fork type quartz crystal vibrator 81 is set at a predetermined position of a substrate 82 and an integrated circuit 83 for an oscillator is arranged in the vicinity of this quartz crystal vibrator. In addition, an electronic part 84 such as a capacitor is mounted. These respective parts are electrically connected in a wiring pattern (not illustrated).

The mechanical vibration of the vibrating piece of the tuning-fork type quartz crystal vibrator 81 is converted into an electric signal by a piezoelectric characteristic belonged to a quartz crystal to be inputted in the integrated circuit 83. Within the integrated circuit 83, the signal processing is carried out and a frequency signal is outputted to function as an oscillator. These respective constituent parts are molded by a resin (not illustrated).

By appropriately selecting the integrated circuit 83, other than a single function oscillator for a clock, the tuning-fork type quartz crystal vibrator 81 has functions to control the operational date and time of the present apparatus and the outer device and to supply the time and the calendar information to a user.

The quartz crystal vibrator on which the quartz crystal vibrating piece manufactured by the manufacturing method according to the present embodiment is mounted is connected to the integrated circuit 83 as the oscillation piece to configure the oscillator. Thereby, the present oscillator is downsized so as to be inexpensively and stably supplied.

Next, an example of an electronic device that the quartz crystal vibrator on which the quartz crystal vibrating piece manufactured by the manufacturing method according to the present embodiment is mounted is connected to a clock unit will be described. Here, as an example of the electronic device, a preferable embodiment in a portable information device represented by a cellular telephone will be described in detail.

At first, as an assumption, the portable information device according to the present embodiment is made by developing and modifying a wrist watch according to a conventional art. The outline is similar to the wrist watch, a liquid display is arranged on a part corresponding to a dial plate, and on this screen, the current time or the like can be displayed.

When using the portable information device of the invention as a communication instrument, taking off it from a wrist, by a speaker and a microphone incorporated in the inside of a band part, the communication that is similar to the cellular phone of the conventional art can be made. However, as compared to the conventional cellular phone, the portable information device of the invention is remarkably reduced in size and weight.

Next, the functional structure of the portable information device according to the present embodiment will be described with reference to the drawings.

Figure 5:
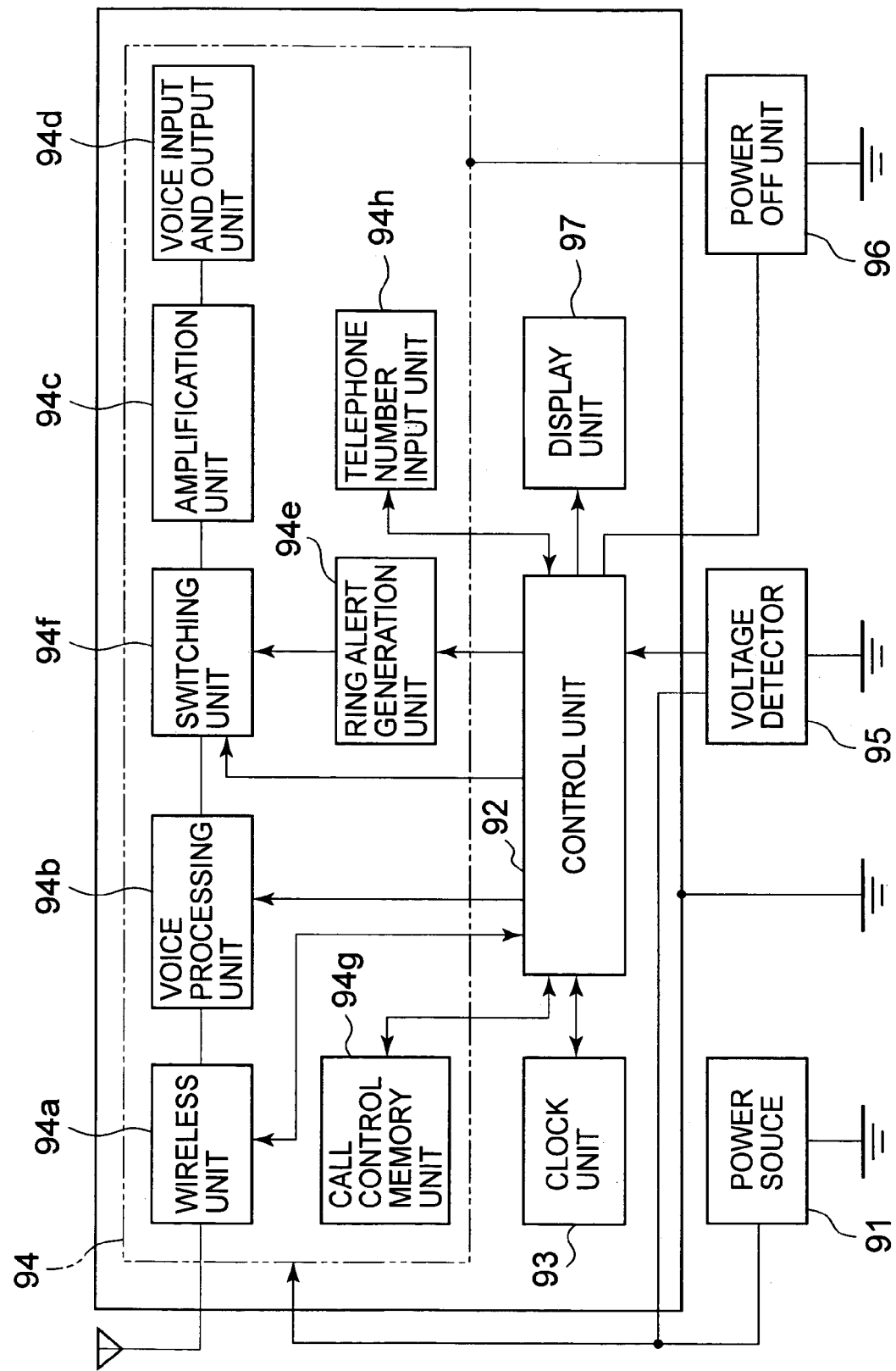
FIG. 5 is a block diagram functionally showing an example of the structure of a portable information device using the quartz crystal vibrator having the quartz crystal vibrating piece that is manufactured by the manufacturing method according to the invention.

FIG. 5 is a block diagram functionally showing an example of the structure of the portable information device according to the present embodiment. In FIG. 5, the power source 91 is a power source unit to supply an electric power to each functional part to be described later. Specifically, this is realized by a lithium-ion secondary battery.

To the power source 91, a control unit 92, a clock unit 93, a communication part 94, a voltage detector 95, and a display unit 97 to be described later are connected in parallel, and an electric power is supplied from the power source 91 to each functional parts.

The control unit 92 controls each functional part to be described later do as to control the operation of the entire system such as transmission and reception of the voice data and measurement and display of the current time or the like. The control unit 92 is specifically realized by a program that has been written in a ROM in advance, a CPU realized by reading the program, and a RAM used as a work area of this CPU or the like.

The clock unit 93 is configured by an oscillation circuit, a register circuit, a counter circuit, an integrated circuit incorporating an interface circuit or the like therein, and a tuning-folk type quartz crystal vibrator as shown FIG. 3.

The mechanical vibration of the tuning-folk type quartz crystal vibrator is converted into an electric signal by piezoelectric characteristic belonged to a quartz crystal to be inputted in the oscillator to be formed by a transistor and a capacitor. The output of the oscillation circuit is made into a binary to be counted by a resistor circuit and a counter circuit. Through an interface circuit, a signal is transmitted and received to and from the control unit via an interface circuit and on the display unit 97, the present time, the present date, or the calendar information are displayed.

The communication part 94 has the same function as the cellular phone of the conventional art and it is configured by a wireless unit 94a, a voice processing unit 94b, an amplification unit 94c, a voice input and output unit 94d, a ring alert generation unit 94e, a switching unit 94f, a call control memory unit 94g, and a telephone number input unit 94h.

The wireless unit 94a transmits and receives various data such as voice data from and to a base station via an antenna. The voice processing unit 94b codes and decodes a voice signal inputted from the wireless unit 94a or the amplification unit 94c to be described later. The amplification unit 94c amplifies a signal inputted from the voice processing unit 94b or the voice input and output unit 94d to be described later to a predetermined level. Specifically, the voice input and output unit 94d is a speaker and a microphone so as to amplify a ring alarm and a received voice and collect a voice of a speaker.

In addition, the ring alert generation unit 94e generates a ring alert in accordance with call from the base station. The switching unit 94f switches the amplification unit 94c connected to the voice processing unit 94b into the ring alert generation unit 94e only when receiving call so as to output the generated ring alert to the voice input and output unit 94d via the amplification unit 94c.

In the meantime, the call control memory unit 94g stores a program with related to calling control of communication. Further, the telephone number input unit 94h is specifically composed of numeric keys from 0 to 9 and other some keys and it inputs a telephone numbers of a call destination or the like.

In the case that the voltage applied to each functional part including the control unit 92 from the power source 91 is below a predetermined value, the voltage detector 95 detects this voltage dropping and notifies the control unit 92 of this.

This predetermined voltage value is a value that has been set in advance as the minimum necessary voltage, which is necessary for stably operating the communication part 94, and for example, it is a voltage about 3V. Notified of the voltage dropping from the voltage detector 95, the control unit 92 inhibits the operations of the wireless unit 94a, the voice processing unit 94b, the switching unit 94f, and the ring alert generation unit 94e. Particularly, it is indispensable to stop the operation of the wireless unit 94a having a large power consumption. At the same time, on the display unit 97, it is displayed that the communication part 94 is unavailable due to lack of remaining battery level.

Due to the activities of the voltage detector 95 and the control unit 92, it is possible to inhibit the operation of the communication part 94 and further, to display this on the display unit 97.

As the present embodiment, by providing a power off unit 96 that selectively can cut off the power source at a portion with related to the function of the communication part, it is possible to stop the function of the communication part in a more complete form.

Further, the display indicating that the communication part 94 is unavailable may be made by a message by letters, however, more intuitively, the display may be made by a method to mark X to a telephone icon on the display unit 97 or the like.

By using a quartz crystal vibrator mounting a quartz crystal vibrating piece according to the present embodiment for an electronic device including the above-described portable information device, the electronic device including these portable information devices is downsized to be inexpensively and stably supplied.

Next, an example of an electric wave clock that a quartz crystal vibrator mounting a quartz crystal vibrating piece that is manufactured by the manufacturing method according to the present embodiment is connected to a filter part will be described.

Figure 6:
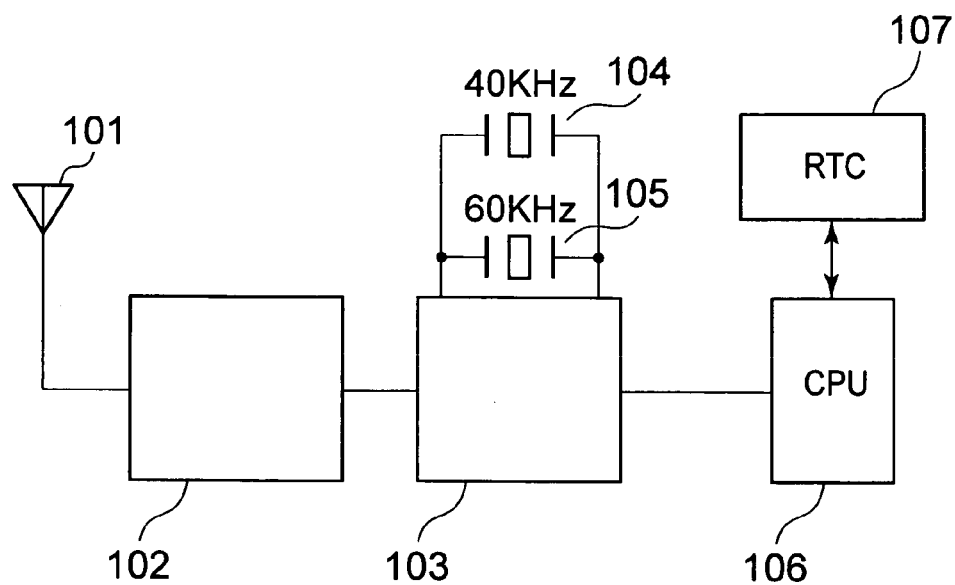
FIG. 6 is a block diagram showing an example of the structure of an electric wave clock that the quartz crystal vibrator having the quartz crystal vibrating piece that is manufactured by the manufacturing method according to the invention is connected to a filter.

FIG. 6 is a circuit block diagram showing the structure of an electric wave clock.

As shown in FIG. 6, the electric wave clock receives a standard wave including a signal referred to as a time code such as 40 KHz, 60 KHz transmitted from a standard wave transmitting station by an antenna 101. The received signal is amplified by an amplifier 102 to be sent to the filter part. Quartz crystal vibrators 104 and 105 that vibrate at the same frequency as the standard wave are connected to the filter part so as to remove a noise. The signal passing through the filter is counted by a CPU 106 and the CPU 106 reads the information such as the current year, the counted day, a day of the week, and a clock time or the like. The read information is reflected on a RTC 107 and a clock continues to tick a correct time.

By using a quartz crystal vibrator mounting a quartz crystal vibrating piece thereon according to the invention for the above-described electric wave clock, this electric wave clock is downsized to be inexpensively and stably supplied.

What is claimed is:

1. A method of manufacturing a quartz crystal vibrating piece, comprising:
   providing a quartz crystal wafer having front and rear surfaces;
   arranging a reference mask on one of the front and rear surfaces of the quartz crystal wafer;
   arranging a relative mask that is larger than the reference mask on the other of the front and rear surfaces of the quartz crystal wafer; and
   etching the quartz crystal wafer from the front and rear surfaces thereof using the reference mask and the relative mask so that a projection is formed on a side of the quartz crystal wafer by the reference mask and overetching the quartz crystal wafer to remove the projection.

2. A method of manufacturing a quartz crystal vibrating piece according to claim 1; wherein the arranging of the reference mask and the relative mask comprises arranging the reference mask with respect to the relative mask so that the reference mask is offset a preselected amount with respect to the relative mask in a length or width direction of the reference mask.

3. A method of manufacturing a quartz crystal vibrating piece, comprising:
   providing a quartz crystal wafer having front and rear surfaces;
   arranging a reference mask on one of the front and rear surfaces of the quartz crystal wafer;
   arranging on the other of the front and rear surfaces of the quartz crystal wafer a relative mask that is larger than the reference mask so that the reference mask is offset in the width or length direction thereof with respect to the relative mask by an amount of not more than 10 µm; and
   etching the quartz crystal wafer using the reference mask and the relative mask.

4. A method of manufacturing a quartz crystal vibrating piece according to claim 1; wherein the arranging of the reference mask and the relative mask comprises arranging the reference mask on the front surface of the quartz crystal wafer and arranging the relative mask on the rear surface of the quartz crystal wafer.

5. A method of manufacturing a quartz crystal vibrating piece according to claim 2; wherein the preselected amount is an amount of not more than 10 µm.

6. A method of manufacturing a quartz crystal vibrating piece according to claim 5; wherein the arranging of the reference mask and the relative mask comprises arranging the reference mask on the front surface of the quartz crystal wafer and arranging the relative mask on the rear surface of the quartz crystal wafer.

7. A method of manufacturing a quartz crystal vibrating piece according to claim 3; wherein the arranging of the reference mask and the relative mask comprises arranging the reference mask on the front surface of the quartz crystal wafer and arranging the relative mask on the rear surface of the quartz crystal wafer.

8. A method of manufacturing a quartz crystal vibrating piece, comprising:
   providing a quartz crystal wafer having front and rear surfaces;
   arranging a first etching mask on the front surface of the quartz crystal wafer;
   arranging a second etching mask on the rear surface of the quartz crystal wafer so that the second etching mask is displaced in a width or length direction thereof with respect to the first etching mask; and
   etching the quartz crystal wafer using the first and second etching masks.

9. A method of manufacturing a quartz crystal vibrating piece according to claim 8; wherein the second etching mask is displaced in a width or length direction thereof with respect to the first etching mask by an amount of not more than 10 μm.

10. A method of manufacturing a quartz crystal vibrating piece according to claim 8; wherein the etching of the quartz crystal wafer comprises etching the quartz crystal wafer from the front and rear surfaces thereof so that a projection is formed on a side of the quartz crystal wafer by the first etching mask due to the second etching mask being displaced in a width or length direction thereof with respect to the first etching mask and overetching the quartz crystal wafer to remove the projection.

11. A method of manufacturing a quartz crystal vibrating piece according to claim 10; wherein the second etching mask is displaced in width or length direction thereof with respect to the first etching mask by an amount of not more than 10 μm.

* * * * *